United States Patent
Pinson et al.

(10) Patent No.: US 6,244,931 B1
(45) Date of Patent: Jun. 12, 2001

(54) BUFFER STATION ON CMP SYSTEM

(75) Inventors: Jay D. Pinson, San Jose; Arulkumar Shanmugasundram, Milpitas; Arnold Aronson, San Jose; Rodney Lum, Pleasanton, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/285,428

(22) Filed: Apr. 2, 1999

(51) Int. Cl.⁷ ........................................... B24B 49/00
(52) U.S. Cl. ..................... 451/8; 451/339; 451/384
(58) Field of Search .................. 451/8, 331, 339, 451/384

(56) References Cited

U.S. PATENT DOCUMENTS

| | | |
|---|---|---|
| 3,968,885 * | 7/1976 | Hassan et al. . |
| 5,240,546 * | 8/1993 | Shiga . |
| 5,518,542 * | 5/1996 | Matsukawa et al. . |
| 5,549,444 * | 8/1996 | Dubuit . |
| 5,658,183 | 8/1997 | Sandhu et al. ............................ 451/5 |
| 5,700,046 * | 12/1997 | Van Doren et al. . |
| 5,730,642 | 3/1998 | Sandhu et al. ............................ 451/6 |
| 5,893,794 * | 4/1999 | Togawa et al. ......................... 451/67 |
| 6,000,998 * | 12/1999 | Anderson, III .......................... 451/9 |

* cited by examiner

Primary Examiner—Timothy V. Eley
(74) Attorney, Agent, or Firm—Thomason, Moser & Patterson (57) ABSTRACT

A chemical mechanical polishing system is provided having a buffer station disposed therein or adjacent thereto. The buffer station includes two or more substrate supports for supporting two or more substrates adjacent to an inspection station. The two or more substrate supports are mounted on a mounting plate which is connected to an actuator for moving a pair of substrate supports laterally towards or away from each other over the inspection station.

15 Claims, 6 Drawing Sheets

BUFFER STATION ON CMP SYSTEM

BACKGROUND OF THE INVENTION

1. Field of the Invention

The present invention relates to a method and apparatus for polishing substrates. More particularly, the invention relates to a buffer station associated with a metrology device on a chemical mechanical polishing tool to improve throughput of the chemical mechanical polishing tool.

2. Background of the Related Art

In the fabrication of integrated circuits and other electronic devices, multiple layers of conducting, semiconducting and dielectric materials are deposited and removed from a substrate during the fabrication process. Often it is necessary to polish a surface of a substrate to remove high topography, surface defects, scratches or embedded particles. The polishing process is often referred to as chemical mechanical polishing (CMP) and is used to improve the quality and reliability of the electronic devices formed on the substrate.

In general, the polishing process involves holding a substrate against a polishing pad under controlled pressure and temperature in the presence of a slurry or other fluid medium. Typically, the polishing process involves the introduction of a chemical slurry during the polishing process to facilitate higher removal rates and selectivity between films on the substrate surface. One polishing system that is used to perform CMP is the Mirra® CMP System available from Applied Materials, Inc. and shown and described in U.S. Pat. No. 5,738,574, entitled "Continuous Processing System for Chemical Mechanical Polishing", the entirety of which is incorporated herein by reference.

One problem encountered in polishing processes is the non-uniform removal of films from the surface of substrates. Removal rate is related to downward pressure on the substrate, rotational speeds of the polishing pad, slurry composition including particle density and size and the effective area of contact between the substrate surface and the polishing pad. Removal rates also tend to be higher at the edge of the substrate as opposed to the center of the substrate.

Another problem encountered in CMP is the difficulty in removing non-uniform layers which have been deposited on the substrate. During fabrication of electronic devices on a substrate, layers are deposited or grown in certain regions on a substrate which may result in an uneven topography over the surface of the substrate. A CMP process can be employed to remove the unwanted topography resulting in a substantially planar surface on the substrate. The thickness of the films deposited on the substrate can be very thin (on the order of 0.5 to 5.0 microns), thereby allowing little tolerance for non-uniform removal. A similar problem arises when attempting to polish warped surfaces on a substrate. Substrates can become warped during the fabrication process due to exposure to various thermal cycles. Due to the warpage experienced by the substrate, the substrate will have high and low areas and the higher areas will be polished to a greater extent than the lower areas.

In order to monitor the production of the electronic devices and in particular to monitor the results of polishing processes, pre and post monitoring systems have been included on CMP systems. One such monitoring system is available from Nova Measuring Instruments Ltd. located in Israel (also Nova Measuring Instruments, Inc. located in Sunnyvale, Calif.) and sold as the NovaScan 420. The NovaScan 420 has been used to advantage in a Mirra® CMP System and provides a wet substrate inspection process to inspect substrates following processing. One disadvantage with available monitoring systems is their single substrate capacity. As a result, the throughput, i.e., the number of substrates processed per unit of time, is lower than desirable. The available monitoring systems have a single substrate support to receive a single substrate for processing. As a result, the robot transfer system must perform numerous movements to effectuate transfer of an evaluated substrate to a storage location within the system and then retrieve and position another substrate in the monitoring system. The additional movements required of the robot transfer system increase the idle time of the monitoring system and increase the amount of time required for substrate handling, thereby decreasing throughput of substrates in the CMP system.

Therefore, there is a need for a CMP tool having a buffer station for supporting one or more substrates to increase the throughput of a CMP tool.

SUMMARY OF THE INVENTION

The present invention generally provides a method and apparatus for storing one or more substrates in a CMP tool. The method and apparatus are preferably adapted to receive two or more substrates and to effectuate a substrate shuttle or hand-off sequence to increase throughput of a CMP system.

In one aspect of the invention, a substrate inspection device is provided having a substrate carrier or buffer station disposed adjacent thereto for receiving two or more substrates, thereby enabling efficient substrate transfer between the buffer station and an automation device, such as a robot. The buffer station preferably includes two or more substrate supports connected to an actuating assembly which moves a pair of substrate supports laterally with respect to each other between a first substrate receiving position, a second closed substrate alignment position and a third substrate pass through position. The supports hold a substrate vertically above the inspection device in the substrate receiving position and the substrate alignment position.

In a preferred embodiment, the substrate supports are mounted to a support strut which in turn is connected to a pneumatic actuating assembly which opens and closes the supports. The substrate supports in one embodiment are connected in a stacked configuration. Alternatively, multiple struts could be provided to support more substrate supports.

According to a method of the invention, a substrate processing sequence is provided wherein a first substrate is loaded into the buffer station and positioned for inspection by an automation device. Upon completion of the inspection process, a second substrate is delivered to a second substrate support disposed adjacent the first substrate support. The processed substrate is removed from the first substrate support and stored in an appropriate location in the system by the automation device. The second substrate is positioned for inspection in the device while the previously inspected substrate is placed at another location in the system. After the inspected substrate has been stored in an appropriate position, the automation device can deliver another substrate to the open substrate support in the buffer station. A system controller is preferably provided to control the operation of the CMP system including transfer of substrates through the system.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
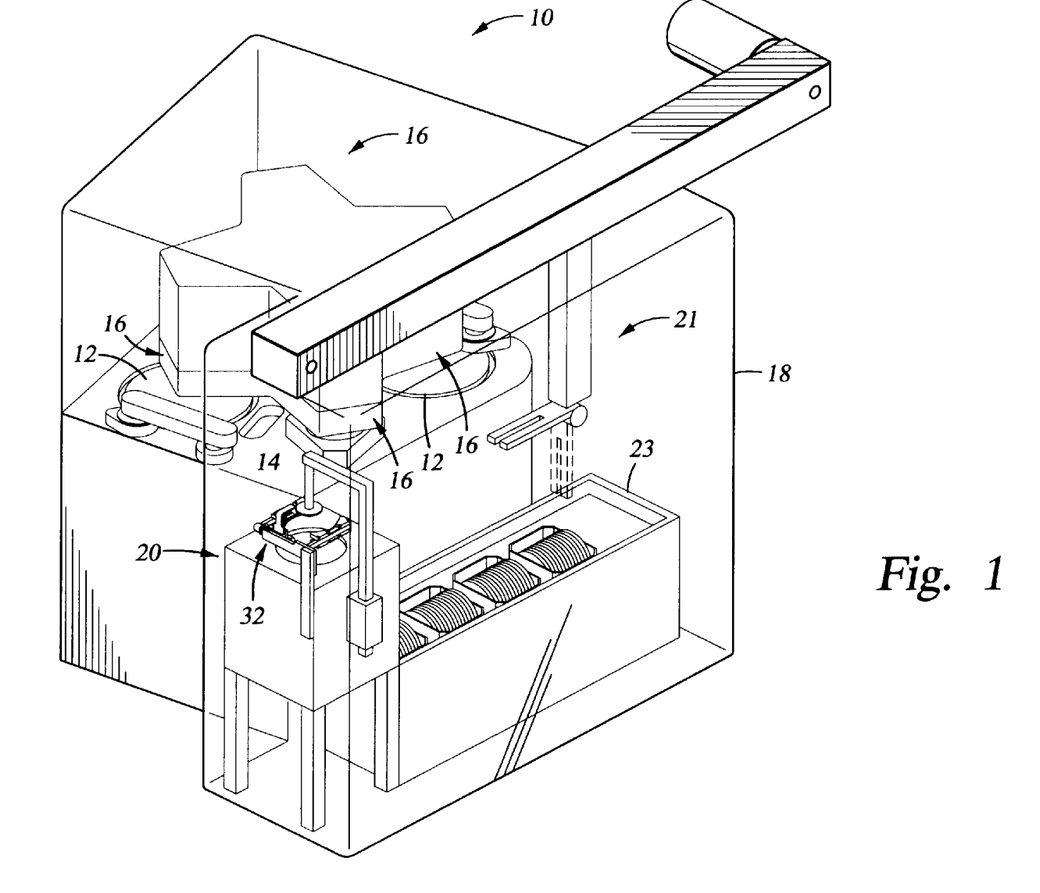
FIG. 1 is a schematic view of a CMP system of the invention.

FIG. 1 is a schematic view of a CMP system 10, such as the Mirra® System available from Applied Materials, Inc. located in Santa Clara, Calif. The system 10 shown includes three rotating platens 12 (only two shown) and a loading station 14. Four polishing heads 16 are rotatably mounted above the rotating platens and the loading station. Typically, a substrate is loaded on a polishing head at the loading station and the polishing head and substrate are then rotated through the three stations having the rotating platens. The three rotating platens 12 typically have polishing pads mounted thereon. One process sequence includes a polishing pad at the first two stations and a cleaning pad at the third station to facilitate substrate cleaning at the end of the polishing process. Alternatively, a polishing pad can be located on each platen.

A front end substrate transfer region 18 is disposed adjacent to the CMP system and is considered a part of the CMP system, though the transfer region may be a separate component. A substrate inspection station 20 is disposed on or near the substrate transfer region to enable pre and/or post process inspection of substrates introduced into the system. One inspection station which can be incorporated into the system and benefit from the invention is the NovaScan 420. Other inspection systems can also be used to advantage in the present invention. One advantage of the NovaScan 420 is that substrates can be introduced into the device in a wet condition and can be maintained in a wet condition during the inspection process to prevent drying of slurry and other materials on the substrate. A overhead automation device 21 (such as a robot) is provided within the transfer region 18 to move substrates from an initial storage bath 23 into the system and back to the storage bath. A buffer station 32 of the invention is disposed over the inspection station 20.

Figure 2:
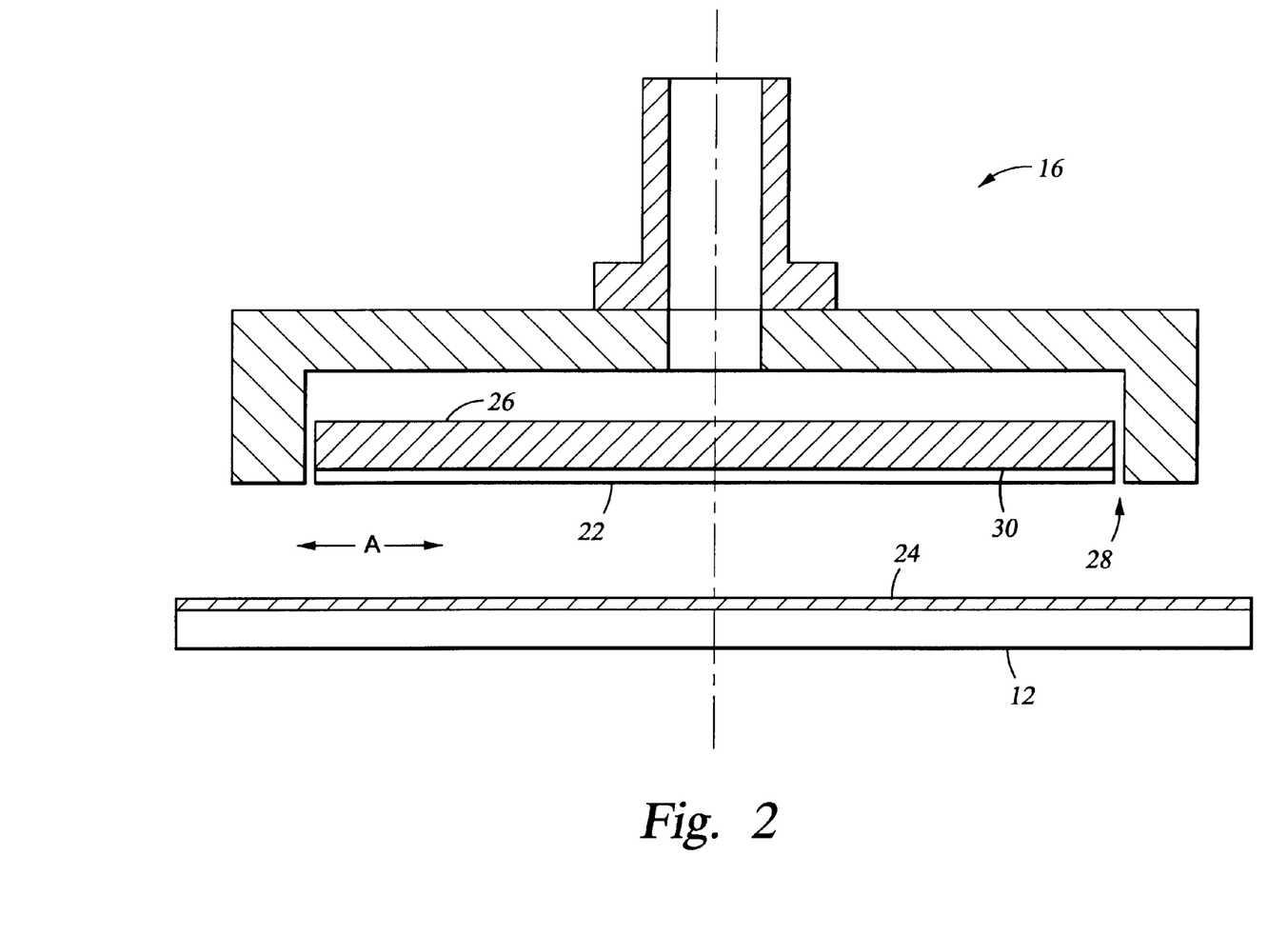
FIG. 2 is a schematic cross sectional view of a polishing station.

FIG. 2 is a schematic view of a polishing station used to advantage with the present invention. A polishing head 16 supports a substrate 22 for polishing. One polishing head which can be used to advantage with the present invention is the Titan Head™ available from Applied Materials, Inc. in Santa Clara, Calif. A rotatable platen 12 is rotated at a velocity $V_p$ about a center axis X by a motor or other suitable drive mechanism. The platen can be rotated in either a clockwise or counterclockwise direction. The platen includes a pad 24 mounted thereon. Pads are available from manufacturers such as Rodel, Inc. The polishing head 16 is preferably connected to a motor or other drive mechanism and is positionable above the platen. The polishing head supports a substrate and holds the substrate against the pad during the polishing process. The polishing head applies a controlled pressure to the backside of the substrate when the substrate is in contact with the pad to facilitate polishing of the substrate surface. A motor or other drive mechanism rotates the polishing head and the substrate at a velocity $V_s$ in a clockwise or counterclockwise direction, preferably the same direction as the platen. The polishing head is also preferably moved radially across the platen in a direction indicated by arrow A. The polishing head includes a vacuum chuck 26 for holding the substrate thereon during processing. The vacuum chuck generates a negative vacuum force behind the surface of the substrate to attract and hold the substrate to the polishing head. The polishing head typically includes a pocket 28 in which the substrate is supported at least initially under the vacuum. Once the substrate is positioned in the pocket and positioned on the pad, the vacuum can be released. A friction surface 30 is provided on the polishing head to prevent rotation of the substrate if the vacuum is removed. While a vacuum chuck is preferred, other substrate holding mechanisms can be used.

Figure 3:
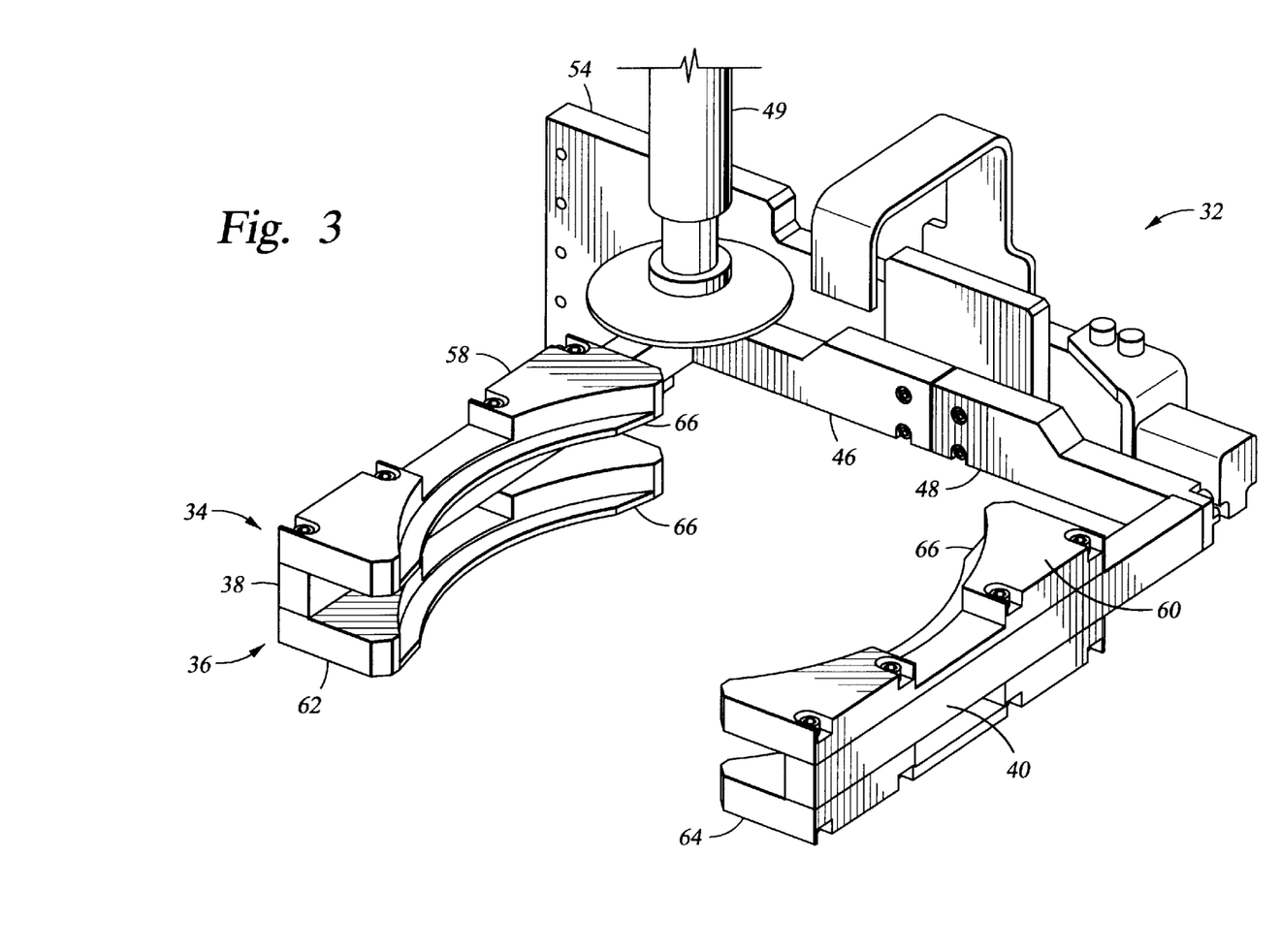
FIG. 3 is a perspective view of a buffer station having two substrate supports.

FIG. 3 is a perspective view of a buffer station 32 having two substrate support assemblies 34, 36 disposed adjacent to an inspection station 20 (shown in FIG. 1). In the embodiment shown, the buffer station is disposed at least partially above the inspection station. The buffer station includes at least two of substrate support assemblies 34, 36 mounted on a pair of support struts 38, 40. The support struts 38, 40 are each cantilever mounted to a movable mounting plate 46, 48, respectively. The movable mounting plates 46, 48 are connected to a mounting plate 54 by a drive assembly 56 (shown in FIG. 4) and an actuator such as a stepper motor or pneumatic cylinder. The drive mechanism moves the support struts 38, 40 and substrate support assemblies connected thereto in a lateral direction either towards or away from each other. A vacuum arm 49 associated with the inspection station picks up a substrate and supports the substrate thereon to move the substrate from a substrate transfer plane down to an inspection plane within the inspection station. The substrate support assemblies 34, 36 include a pair of opposed plates 58, 60, 62, 64 having a substrate supporting shoulder or recess 66 formed partially thereon to support a substrate. Each opposed pair of recesses 66 form a substrate support around opposite edges of a substrate.

Figure 4:
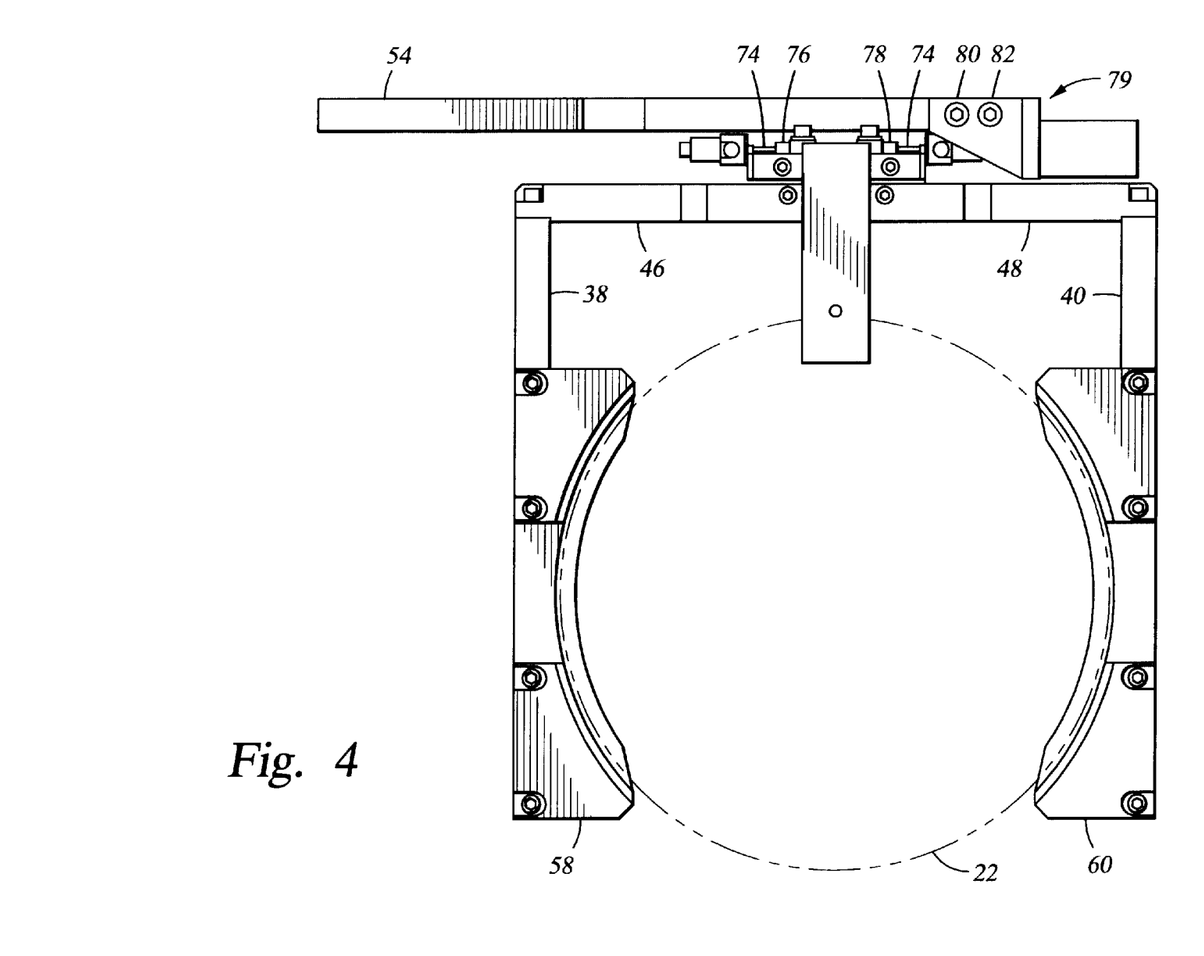
FIG. 4 is a top view of an upper substrate supporting assembly showing a pair of substrate support plates mounted to a pair of movable struts.

FIG. 4 is a top view of an upper substrate supporting assembly showing a pair of substrate support plates 58, 60 mounted to a pair of movable struts 38, 40. A substrate 22 is shown disposed thereon. The movable struts are each mounted to a movable mounting plate 46, 48 which in turn is connected to a guide pin 74 by a linear guide, 76, 78, respectively. A fluid inlet 80 and outlet 82 deliver a fluid to a pneumatic actuator 79 to move the support struts into three positions: a substrate centering position, a substrate receiving position or an open position to enable a substrate to pass therethrough. FIG. 4 shows the buffer station in a substrate receiving position wherein a small gap is defined between the edge of the substrate and the substrate support plates 58, 60.

Figure 5:
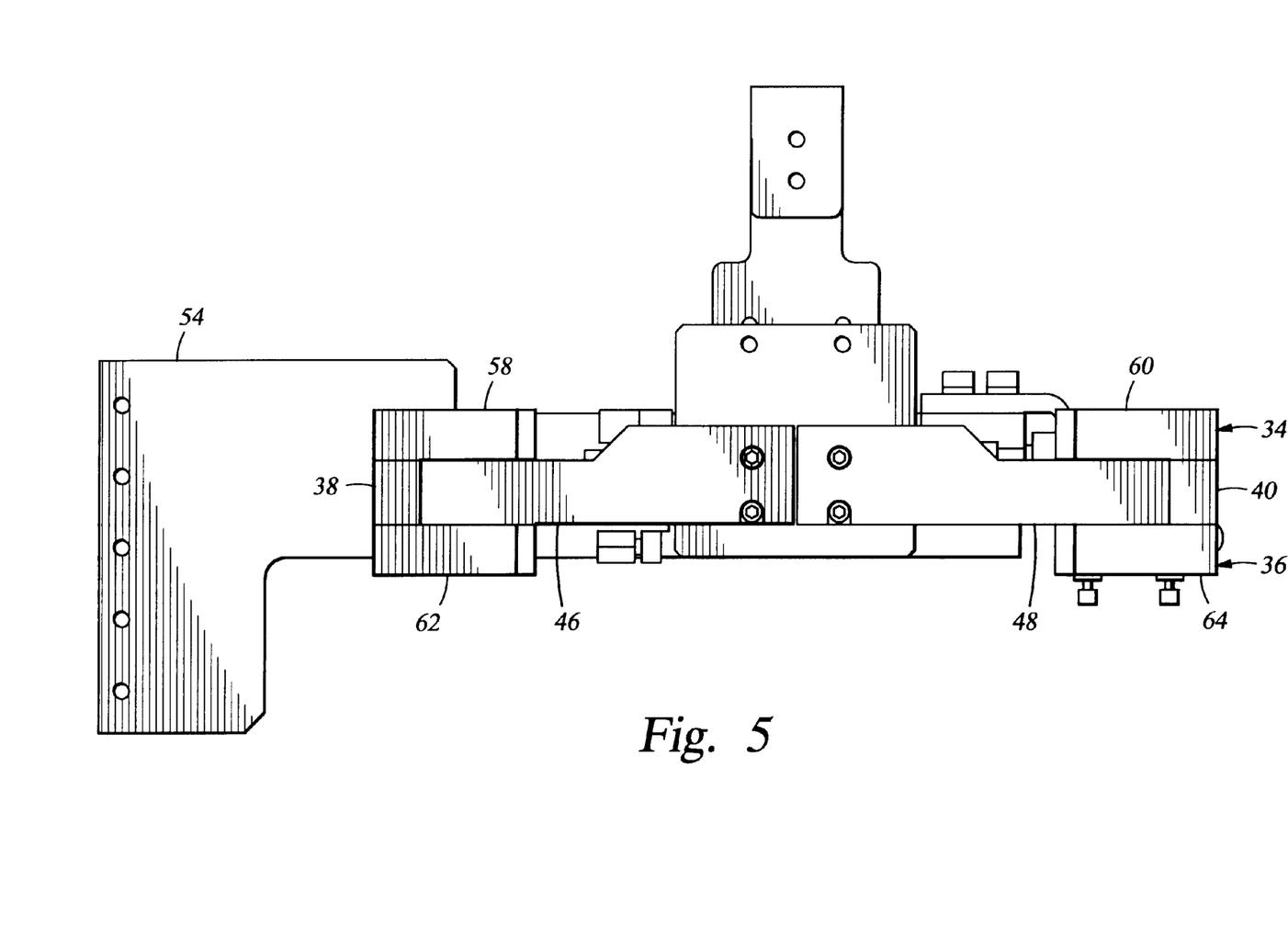
FIG. 5 is a front elevation view showing two substrate support assemblies mounted in a stacked vertical relationship.

FIG. 5 is a front elevation showing the at least two substrate support assemblies 34, 36 mounted in a stacked vertical position in a substrate centering position. The movable mounting plates 46, 48 are in a retracted position for substrate centering. In this position, the substrate support plates 58, 60, 62, 64 are also in a closed substrate centering position. As fluid is delivered to the pneumatic actuator, the movable mounting plates 46, 48 move laterally apart to either a substrate receiving position or a substrate pass through position.

Figure 6:
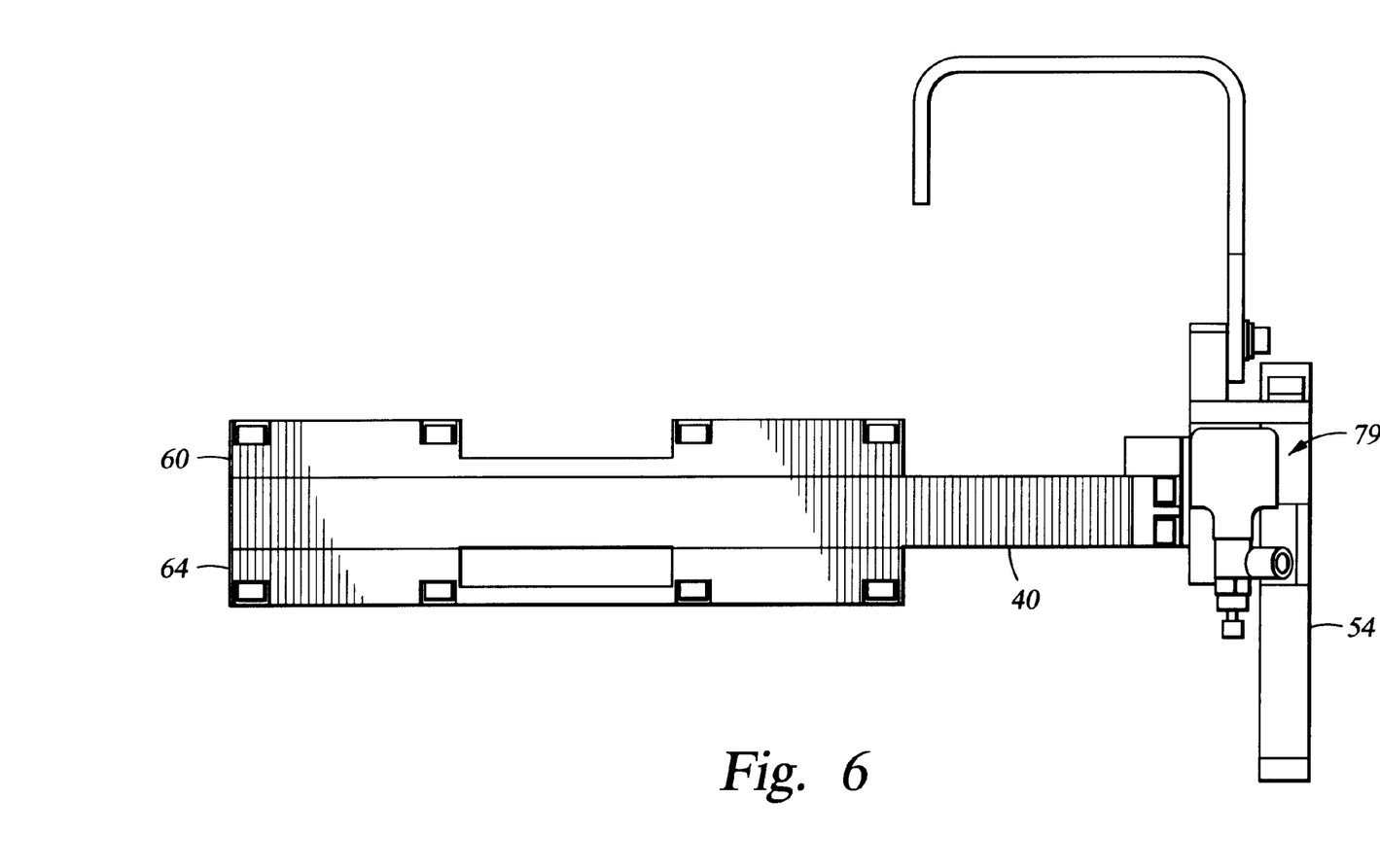
FIG. 6 is a side elevation showing two substrate support assemblies in a stacked configuration.

FIG. 6 is a side elevation of the buffer station showing the spacing between two adjacent substrate support plates 60, 64. Sufficient spacing is provided between the substrate support plates, and the substrate supporting surface of the support shoulder 66 to allow a robot blade to pass between two substrates positioned on each pair of spaced substrate support plates and to enable a substrate to be delivered to the support shoulder 66 and picked up therefrom. The thickness of the supports 38, 40 can be sized to provide the requisite spacing between the plates. In addition, the plates can be sized and adapted to provide the requisite spacing.

In operation, a substrate transfer robot delivers a first substrate to either the upper or lower substrate support assembly 34, 36, the upper substrate support in this example, which are in a substrate receiving position. A vertical actuator on the robot enables the robot to lower the substrate onto the upper substrate support plates 58, 60 and the pneumatic actuator closes the movable mounting plates 46, 48 to center the substrate supported on the upper plates 58, 60. The robot is then retracted. The vacuum arm 49 of the inspection device is then lowered to mount the substrate to its lower end. The substrate support plates are then opened to enable the vacuum arm 49 to move the substrate supported thereon downwardly through the support plates and into the inspection device. Upon completion of the inspection process, the vacuum arm moves the substrate above the upper or lower substrate support assemblies 34, 36 while the support plates are in the opened pass through position. Once the substrate is positioned above the desired pair of plates, the substrate support assemblies are closed to the substrate receiving position. The vacuum arm 49 delivers the substrate to the support plates are releases the substrate to be supported on the desired set of plates. Next, a robot delivers a second substrate to the unoccupied pair of support plates through the operation described above. Next, the robot picks up the inspected substrate by reversing the sequence of delivery steps. The inspected substrate is positioned on the robot and the robot retracts and moves the inspected substrate to another location in the system. After the inspected substrate is removed, the vacuum arm 49 picks up the new substrate and the sequence used to move a substrate into the inspection device is performed.

This manner of operation enables a substrate shuttle operation to be performed wherein a substrate requiring inspection is positioned onto a substrate support and the inspected substrate is removed without requiring the robot to retrieve and place the inspected substrate before a second substrate can be picked up and transferred to a substrate support and into the inspection system. A system controller is preferably provided to control substrate transfer through the system, including into and from the inspection device.

It is to be understood that terms such as upward, downward, lateral, vertical and the like are relative terms and are not intended to be limiting. Other configurations are contemplated where substrate can be handled in different orientations.

While foregoing is directed to the preferred embodiment of the present invention, other and further embodiments of the invention may be devised without departing from the basic scope thereof, and the scope thereof is determined by the claims that follow.

What is claimed is:

1. An apparatus for supporting substrates in a substrate processing system, comprising:
    (a) at least two substrate support assemblies mounted between opposing support struts;
    (b) one or more mounting plates connected to the substrate support assemblies; and
    (c) a drive mechanism coupled to the support struts.

2. The apparatus of claim 1 wherein the substrate support assemblies comprise two support plates which are mounted one to a support strut.

3. The apparatus of claim 1 further comprising an actuator coupled to each of the support struts supporting each substrate support assembly.

4. The apparatus of claim 3 wherein the actuator comprises a pneumatic actuator.

5. An apparatus for processing substrates, comprising:
    (a) a chemical mechanical polishing system comprising:
        (1) a front end transfer region;
        (2) a loading station;
        (3) one or more polishing stations having a rotatable platen;
        (4) one or more polishing heads rotatably mounted above the loading station and the one or more rotatable platens;
    (b) an inspection station disposed adjacent the front end transfer region; and
    (c) a buffer station disposed at least partially above the inspection station comprising:
        (1) at least two substrate supports mounted between opposing support struts;
        (2) one or more mounting plates connected to the substrate supports; and
        (3) a drive mechanism connected to the support struts.

6. The apparatus of claim 5 wherein the substrate supports comprise two support plates which are mounted to a support strut.

7. The apparatus of claim 5 wherein the substrate supports comprise two support plates, each support plate being mounted to a strut.

8. The apparatus of claim 7 further comprising an actuator connected to each of the support struts supporting each substrate support.

9. The apparatus of claim 8 wherein the actuator comprises a pneumatic actuator.

10. An apparatus for polishing substrates, comprising:
    a) a substrate processing system having a platen, a polishing head to support a substrate during polishing and a robot to transfer substrates into and out of the polishing system;
    b) a substrate monitoring device disposed adjacent the polishing system;
    c) a buffer station disposed at least partially above the substrate monitoring device, the buffer station comprising two or more pairs of substrate support assemblies coupled to a linear actuator.

11. The apparatus of claim 10 wherein the linear actuator moves two substrate support plates comprising each pair of substrate support assemblies linearly towards or away from each other.

12. The apparatus of claim 11 further comprising a robot to transfer substrate to and from the buffer station.

13. The apparatus of claim 12 wherein the linear actuator is a pneumatic valve assembly which moves each pair of substrate support assemblies into at least a substrate receiving position and a substrate pass through position.

14. The apparatus of claim 13 wherein the substrate support plates are coupled to support struts which are cantilever mounted to one or more mounting plates.

15. A system for polishing a substrate comprising:

a polishing station for polishing a face of a substrate, the polishing station including at least one platen and at least one polishing head mounted above the at least one platen, the at least one polishing head being adapted to hold a substrate to position a face of the substrate to be polished in contact with a polishing surface of the platen;

an inspection station for inspecting a polished substrate and for determining a condition of said polished substrate; and a robotic shuttle mechanism which transfers polished substrates between said polishing station and said inspection station, the shuttle mechanism including a first robot, a buffer station and a second robot, said buffer station including at least two substrate supports, said first robot being adapted to transfer a polished substrate between said polishing station and said substrate supports, and said second robot being adapted to transfer a polished substrate between said substrate supports and said inspection station, wherein a polished substrate requiring inspection may be placed onto a first substrate support by the first robot and an inspected substrate may be placed onto a second substrate support by the second robot.

* * * * *